United States Patent
Lentz et al.

(10) Patent No.: US 10,031,173 B2
(45) Date of Patent: Jul. 24, 2018

(54) ARC FAULT AND GROUND FAULT INTERRUPTER USING DUAL ADC

(71) Applicant: SCHNEIDER ELECTRIC USA, INC., Palatine, IL (US)

(72) Inventors: Brennan T. Lentz, North Liberty, IA (US); Joseph R. Beierschmitt, Marion, IA (US); Randall J. Gass, Cedar Rapids, IA (US); Issa V. Dramé, West Allis, WI (US)

(73) Assignee: Schneider Electric USA, Inc., Andover, MA (US)

( * ) Notice: Subject to any disclaimer, the term of this patent is extended or adjusted under 35 U.S.C. 154(b) by 84 days.

(21) Appl. No.: 14/709,164

(22) Filed: May 11, 2015

(65) Prior Publication Data

US 2016/0334454 A1    Nov. 17, 2016

(51) Int. Cl.
| | |
|---|---|
| *H02H 3/00* | (2006.01) |
| *G01R 31/00* | (2006.01) |
| *G01R 31/02* | (2006.01) |
| *G01R 31/12* | (2006.01) |
| *H02H 1/00* | (2006.01) |
| *H02H 3/16* | (2006.01) |
| *H02H 3/33* | (2006.01) |
| *H02H 3/347* | (2006.01) |
| *H02H 3/32* | (2006.01) |

(Continued)

(52) U.S. Cl.
CPC ....... *G01R 31/025* (2013.01); *G01R 31/1227* (2013.01); *G01R 31/3275* (2013.01); *H02H 1/0015* (2013.01); *H02H 1/0092* (2013.01); *H02H 3/162* (2013.01); *H02H 3/32* (2013.01); *H02H 3/331* (2013.01); *H02H 3/347* (2013.01); *G01R 19/2506* (2013.01); *H02H 3/05* (2013.01)

(58) Field of Classification Search
CPC .............. G01R 31/025; G01R 31/1227; H02H 1/0015; H02H 3/347; H02H 3/162; H02H 3/331; H02H 1/0092; H02H 3/05
USPC ............................................. 324/503; 361/45
See application file for complete search history.

(56) References Cited

U.S. PATENT DOCUMENTS

| 5,475,556 A | 12/1995 | Yoon et al. |
| 7,193,827 B2 | 3/2007 | Reid et al. |

(Continued)

FOREIGN PATENT DOCUMENTS

WO    2015038140    3/2015

OTHER PUBLICATIONS

PIC24FJ64GA004 Family, 28/44-Pin General Purpose, 16-Bit Flash Microcontrollers, Microchip Technology Inc., 2011, pp. 1-278.

(Continued)

*Primary Examiner* — Farhana Hoque
(74) *Attorney, Agent, or Firm* — Locke Lord LLP (57) ABSTRACT

Method and system for performing arc fault and ground fault detection in a dual function CAFI/GFCI circuit breaker uses two analog-to-digital converters (ADC), one for performing arc fault sampling and one for performing ground fault sampling. Each ADC operates independently of the other ADC and may be accessed as needed by the microcontroller without interfering with the operation of the other ADC. Such simultaneous use of multiple ADCs minimizes or eliminates the need for complex time slicing and similar control schemes, thus freeing up the microcontroller for other operations and fault detection related tasks.

14 Claims, 6 Drawing Sheets

(51) Int. Cl.
    *G01R 31/327*      (2006.01)
    *H02H 3/05*      (2006.01)
    *G01R 19/25*      (2006.01)

(56) References Cited

U.S. PATENT DOCUMENTS

| | | | |
|---|---|---|---|
| 2012/0089266 A1* | 4/2012 | Tomimbang | H02H 1/0015 700/293 |
| 2012/0119751 A1* | 5/2012 | Scott | H02H 1/0015 324/509 |
| 2013/0128396 A1* | 5/2013 | Danesh | G01R 19/00 361/45 |

OTHER PUBLICATIONS

PIC16LF1554/1559, 20-Pin Flash, 8-Bit Microcontrollers with XLP Technology, Microchip Technology Inc., 2011, pp. 1-339.
EP Search Report for EP Application No. EP16166635 dated Sep. 26, 2016.
EP Extended Search Report for EP Application No. EP16166635.9 dated Apr. 10, 2017.

* cited by examiner

ARC FAULT AND GROUND FAULT INTERRUPTER USING DUAL ADC

FIELD OF INVENTION

The embodiments disclosed herein relate generally to methods and systems for protecting against ground faults and arc faults, and particularly to a method and system for protecting against ground faults and arc faults that employ a microcontroller and separate analog-to-digital converters (ADC).

BACKGROUND OF INVENTION

Ground fault circuit interrupters (GFCI) and arc fault circuit interrupters (AFCI) are well known in the art. A GFCI is designed to detect a ground fault, which is an unintended conductive path between an ungrounded current carrying conductor and ground. The term "ground fault" generally includes both a "ground-fault" and a "grounded-neutral fault." Ground-faults may be detected by sampling the current in a sense circuit on the secondary side of a transformer during a designated time interval and comparing the samples to a reference value. The sampling of the current is typically done by an ADC and involves conversion of the current from a continuous analog signal to digital data. Grounded-neutral faults may be detected by injecting current into the sense circuit during a separate time interval to produce a decaying sinusoidal signal in the sense circuit, then sampling the sinusoidal signal to determine the presence of a grounded-neutral fault.

An AFCI on the other hand, is designed to detect electrical arcing or arc faults. Arc faults are usually intermittent and do not generate sustained currents of sufficient magnitude to trip a conventional circuit breaker, so inputs such as band-pass filters, line current sensors, and voltage sensors must be sampled at regular intervals in order to detect an arc fault. Presently, combination arc fault circuit interrupters (CAFI) are available that can detect both parallel arcing (i.e., arcing between two conductors or between a conductor and ground) and series arcing (i.e., arcing across a break in a conductor, such as a damaged electrical cord).

Attempts to integrate CAFI and GFCI into a single, dual function CAFI/GFCI circuit breaker have met with mixed results. This is because, as a general rule, design strategies stress using a bare minimum number of components to achieve a desired function. Accordingly, most dual function circuit breakers use a microcontroller and one ADC to perform both the ground fault sampling and the arc fault sampling. However, while ground-fault sampling and grounded-neutral fault sampling may take place during separate time intervals, arc fault sampling can overlap with both ground-fault and grounded-neutral fault sampling. Such overlap can create conflicts requiring stringent timing constraints as well as other conflict avoidance measures in the microcontroller.

As an example, some dual function circuit breakers employ a complex scheme involving time slicing where the microcontroller allocates access to the ADC according to a precise schedule for the required samplings. In this scheme, the ADC is shared among multiple detection algorithms, each running in its own detection interval and each requiring different sequences of sensor signals to be sampled. Multiple priority-nested interrupts, timers, and state machines are needed to control program flow in such a scheme, which can render operation of the different detection algorithms less deterministic and more difficult to maintain.

Accordingly, what is needed is a way to minimize or eliminate timing and resource conflicts in a dual function CAFI/GFCI circuit breaker.

SUMMARY OF THE INVENTION

The disclosed embodiments provide a method and system for performing arc fault and ground fault detection in a dual function CAFI/GFCI circuit breaker that can minimize or eliminate timing and resource conflicts. The method and system provide a dual function circuit breaker that uses two separate ADCs, one for performing sampling with respect to arc fault detection and one for performing sampling with respect to ground-fault and grounded-neutral fault detection. Each ADC operates independently of the other ADC and may be accessed by a controller as needed without interfering with operation of the other ADC. Such simultaneous use of multiple ADCs minimizes or eliminates the need for complex time slicing and similar control schemes, thus freeing the controller for other operations and fault detection related tasks.

In some embodiments, the ADCs may be in the form of individual ADC modules integrated or otherwise embedded within the controller, which may be a microcontroller, FPGA, ASIC, and the like. Each of the ADC modules may be dedicated to sampling a different fault sensor of the circuit breaker. For example, one ADC module may have its input channel connected to an arc fault sensor while the other ADC module may have its input channel connected to a ground fault sensor. Each ADC module may be configured to sample its sensor at a different sampling frequency depending on the needs of the respective detection algorithms. This allows each ADC module to run independently and in parallel with the other ADC module, thus providing greater flexibility for the controller.

In some embodiments, when an ADC module has finished sampling its fault sensor according to its respective sampling frequency, a software interrupt may be triggered to store digital data resulting from the sampling in a buffer for subsequent use by the microcontroller. Alternatively, a direct memory access (DMA) module may be provided in the microcontroller that can directly access and obtain the resulting digital data from the ADC modules and store the data for subsequent use by the microcontroller.

In embodiments where each ADC module is configured to sample a single ground fault or arc fault sensor, the ADC module may have a single input and a single output, as in the case of a single-pole circuit breaker. In some embodiments, however, each ADC module may be configured to sample multiple ground fault sensors or multiple arc fault sensors, as in the case of a multi-pole circuit breaker. In these embodiments, each ADC module may have two or more inputs and two or more outputs that are used (or not used) as needed. It is also possible to have a third ADC module, for example, in order to divide up the ground fault sampling into separate ground-fault sampling and grounded-neutral fault sampling, or to perform some other operation in support of the single-pole or multi-pole circuit breaker.

In some embodiments, instead of ADC modules that are integrated or embedded in the microcontroller, the ADC modules may be provided as separate components that are external to the microcontroller. If used, the external ADC modules may interface to or otherwise communicate with the DMA module instead of the microcontroller in these embodiments. Alternatively, a combination of integrated and external ADC modules may also be used.

In general, in one aspect, the embodiments disclosed herein relate to dual function circuit breaker comprising a controller programmed to detect arc faults and ground faults. The dual function circuit breaker also comprises a first ADC module accessible by the controller and configured to perform sampling of an arc fault signal and a second ADC module accessible by the controller and configured to perform sampling of a ground fault signal. The dual function circuit breaker further comprises an arc fault sensor configured to provide the arc fault signal to the first ADC module and a ground fault sensor configured to provide the ground fault signal to the second ADC module. The controller is programmed to access the first ADC module and the second ADC module independently of each other to obtain data for detecting the arc faults and ground faults, respectively.

BRIEF DESCRIPTION OF DRAWINGS

The foregoing and other aspects of the disclosed embodiments will become more apparent from the following detailed description and the drawings, wherein.

DETAILED DESCRIPTION OF DISCLOSED EMBODIMENTS

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
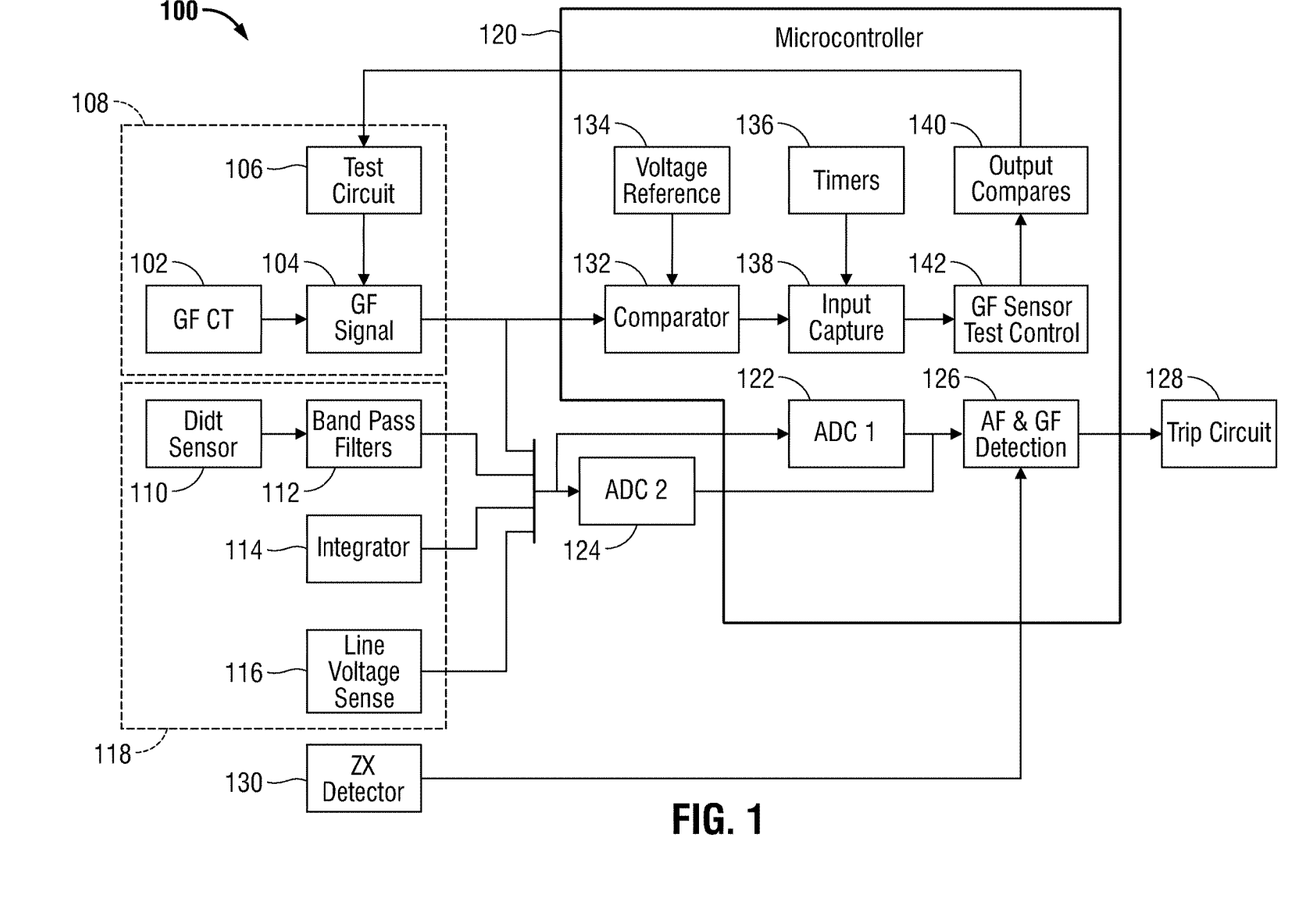
FIG. 1 is an exemplary block diagram of a dual function circuit breaker in accordance with the embodiments disclosed herein.

Referring now to FIG. 1, a microcontroller-based dual function CAFI/GFCI circuit breaker 100 is shown in block diagram form according to the embodiments disclosed herein. The circuit breaker 100 shown here is a single-pole circuit breaker, but those having ordinary skill in the art will understand that the principles taught herein are also applicable to multi-pole circuit breakers. As alluded to earlier, the dual function circuit breaker 100 is capable of detecting both ground faults and arc faults without mutual interference or resource conflicts because it uses at least two ADC modules, one for performing ground fault sampling and one for performing arc fault sampling, as further discussed below. The two ADC modules allow the circuit breaker 100 to schedule the sampling for ground fault detection separately and independently from the sampling for arc fault detection. This helps the circuit breaker 100 avoid the need to implement complex time slicing and similar control schemes, thus freeing internal resources for other operations and fault detection related activities.

As can be seen in FIG. 1, the dual function circuit breaker 100 may be composed of a number of functional components, represented here by individual blocks. Each block may of course be divided into several constituent blocks, or two or more blocks may be combined into a single block, without departing from the scope of the disclosed embodiments. In this embodiment, the dual function circuit breaker 100 may include a ground fault current transformer 102, a ground fault sense signal conditioning circuit 104, and a test circuit 106, which may be a push-to-test circuit operable to provide a load and a step signal for testing purposes. These components together form a ground fault sense circuit 108 acting as a ground fault sensor when arranged as shown. Also present are a current sensor 110, one or more bandpass filters 112, an integrator 114, and a line voltage sensor 116. These components together form an arc fault sense circuit 118 acting as an arc fault sensor when arranged as shown.

The use of the foregoing components for ground fault and arc fault detection is well known in the art and therefore only a high-level description of their specific functions will be provided below. In general operation, a controller 120 in the dual function circuit breaker 100 receives the signals from the ground fault sense circuit 108 and the arc fault sense circuit 118 to detect ground faults and arc faults, respectively. The controller 120 may be any suitable controller known to those having ordinary skill in the art, including a PIC16LF1554/9, PIC24FJ32GA002, or similar microcontroller from Microchip Technology, Inc., as well as a digital signal processor (DSP), an ASIC device, and the like.

For the microcontroller 120 to process the signals from the ground fault sense circuit 108 and the arc fault sense circuit 118, the signals must first be converted from continuous analog signals to discrete digital data. In accordance with the disclosed embodiments, the circuit breaker 100 counterintuitively (and contrary to prevailing industry design strategies) uses at least two dedicated ADC modules 122 (ADC 1) and 124 (ADC 2) to receive and convert the signals from the ground fault sense circuit 108 and the arc fault sense circuit 118, respectively, from analog signals to digital data. One of the ADC modules 122 or 124 may be embedded within the microcontroller 120 while the other ADC module 122 or 124 may be external to the microcontroller 120. Alternatively, as will be discussed later herein, both of the ADC modules 122 and 124 may be embedded within the microcontroller 120 or both may be external to the microcontroller 120.

In any case, the ADC modules 122 and 124 are designed to convert analog signals to digital data and then provide the data to an arc fault and ground fault detection unit 126 in the microcontroller 120 for further processing and fault detection. In the embodiment shown here, the first ADC module 122 (ADC 1) is configured to sample and convert ground fault signals to digital data and the second ADC module 124 (ADC 2) is configured to sample and convert arc fault signals to digital data. In alternative embodiments, the roles of the two ADC modules 122 and 124 may be reversed. The arc fault and ground fault detection unit 126 detects whether an arc fault, ground-fault, or grounded-neutral fault has occurred based on the digital data from the ADC modules 122 and 124, respectively, and activates a current interrupt or trip circuit 128 accordingly. The fault detections may be synchronized to or initiated by a zero-crossing signal from a line voltage zero-crossing detector 130 that detects an alternating current (AC) zero crossing made by the supply line (not expressly shown).

Other components that may be present in the circuit breaker 100 include a comparator 132 in the microcontroller 120 that receives the signal from the ground fault sense circuit 108 and compares it to a programmable voltage reference 134 (Vref) for purposes of ground fault sensor testing. As well, the microcontroller 120 may include one or more timers 136 for keeping track of time and for driving peripheral devices as needed, an input capture module 138 for providing timestamps as triggered by the comparator 132, one or more output compare modules 140 for automating the ground fault sensor testing, and a ground fault sensor test control 142 for controlling the timing of a step signal that may be applied to the ground fault signal conditioning circuit 104 via the test circuit 106.

The use of two ADC modules with one microcontroller, while unconventional, provides several advantages over more mainstream solutions, such as a single-microcontroller/single-ADC solution. For example, having two ADC modules provides much more flexibility with respect to the sampling rate for the signals from the ground fault sense circuit 108 and the arc fault sense circuit 118. With a single-ADC solution, time slicing must be implemented, which limits the sampling rate for each signal to a small range of possible frequencies that are compatible with the sampling rate of the other signal in order to allow time slicing of the ADC resource. However, with a dual ADC approach, sampling of the signals from the ground fault sense circuit 108 and the arc fault sense circuit 118 may take place independently and in parallel, which allows one or both sampling frequencies to be significantly faster or slower compared to a single-ADC solution.

Having dual dedicated ADC modules also gives programmers more leeway in terms of the design and functionality of the ground fault and arc fault detection algorithms. For example, the dual ADC modules allows greater partitioning and/or separation of the ground fault and arc fault detection algorithms within the firmware of the microcontroller 120, which may provide greater robustness and maintainability of the firmware. In contrast, a single-microcontroller/single-ADC solution may create additional complications in product design as a result of the time slicing scheme mentioned above and other resource sharing conflicts.

As well, having at least two ADC modules reduces overall microcontroller utilization, as the microcontroller 120 would otherwise need to reconfigure a single ADC for different sampling schemes depending on whether the ground fault sensor signal or the arc fault sensor signal needs to be sampled, as would be the case with a single-microcontroller/single-ADC solution. In a similar manner, the use of independent sampling frequencies for each ADC module may also improve overall power consumption and lower heat output in the circuit breaker 100. For example, one ADC module may be disabled or put into sleep mode after sampling is finished without affecting the operation of the other ADC module. When the other ADC module is finished sampling, it may likewise be disabled or put into sleep mode such that both ADC modules may be disabled or sleeping at the same time for a certain amount of time. As well, one or both ADC modules may be disabled or put into sleep mode for a longer period of time and thus consume less power overall compared to a single-microcontroller/single-ADC solution, where one ADC performs all the sampling.

The use of at least two ADC modules, particularly with a single microcontroller, also enables redundancy in sampling. For example, in some embodiments, it may be desirable to configure both ADC modules for sampling the same fault sensor signal or signals for purposes of detecting a failure in one of the ADC modules. In these embodiments, sampling may be performed on the same ground fault sensor signal by both ADC modules at substantially the same time, and/or sampling may be performed on the same arc fault sensor signal by both ADC modules at substantially the same time. The results from the ADC modules may then be compared to determine if there are potential problems internally to either of the ADC modules. Such redundant sampling would not be feasible in a single-microcontroller/single-ADC solution.

Figure 2:
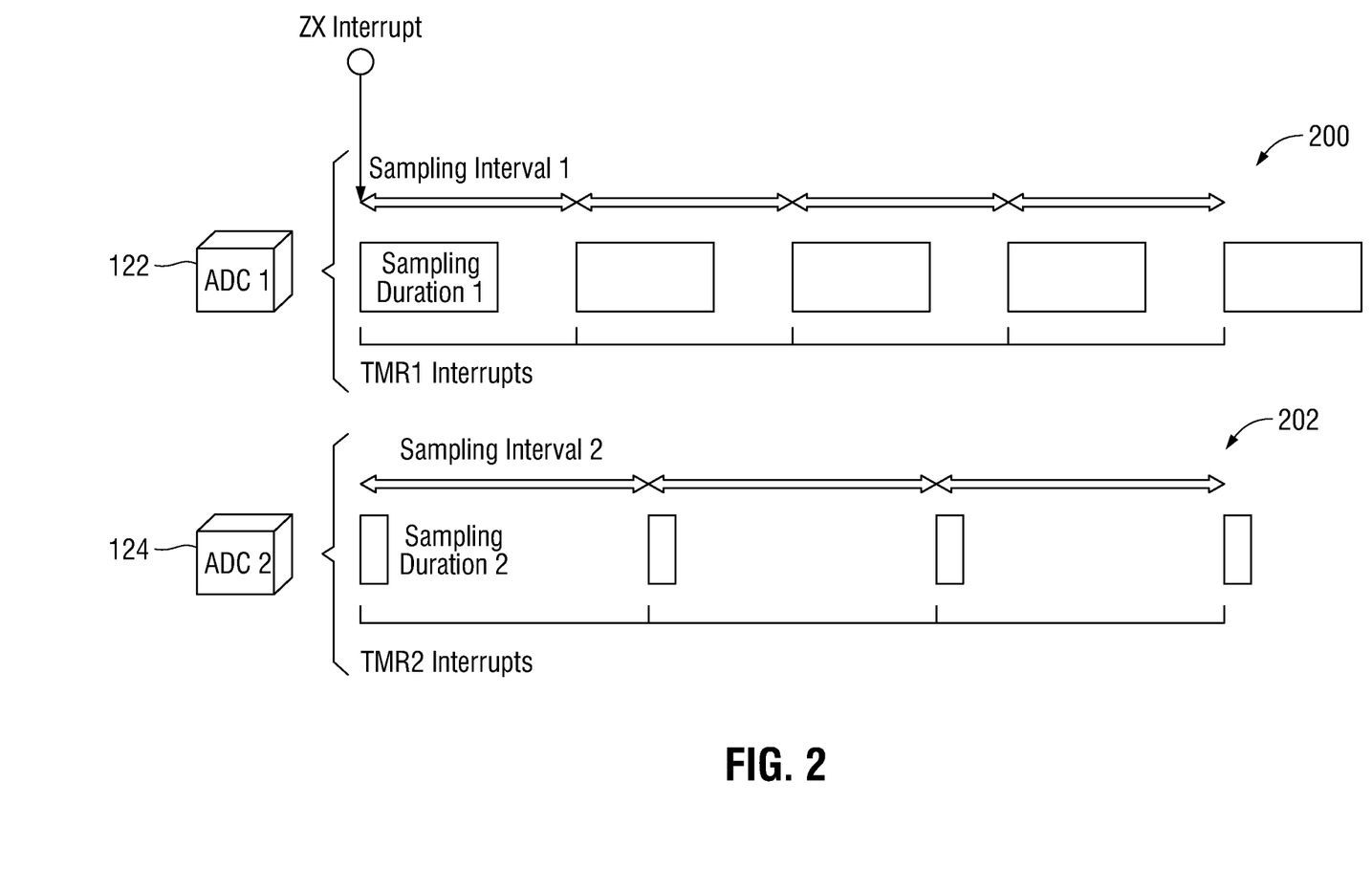
FIG. 2 is an exemplary timing diagram for a dual function circuit breaker in accordance with the embodiments disclosed herein.

Turning now to FIG. 2, a pair of timing diagrams 200 and 202 is shown illustrating some of the advantages of using two ADC modules 122 and 124. Each timing diagram 200 and 202 is synchronized to or initiated by a zero-crossing interrupt signal ("ZX Interrupt"), which may be issued by the zero crossing detector 130 (see FIG. 1) based on detection of a supply line zero crossing. Each timing diagram 200 and 202 is also sectioned into a series of sampling intervals, Sampling Interval 1 and Sampling Interval 2, respectively, within which sampling is performed by the respective ADC module 122 and 124. The lengths of the sampling intervals are defined by timer interrupt signals, TMR 1 Interrupt and TMR 2 Interrupt, respectively, that may be issued by the one or more timers 134 based on the specific sampling frequency used for each ADC module 122 and 124.

As can be seen, each ADC module 122 or 124 may have a sampling interval that is independent of (e.g., longer, shorter, same as) the sampling interval of the other ADC module 122 or 124. In addition, each ADC module 122 or 124 may have a sampling duration, Sampling Duration 1 and Sampling Duration 2, that is independent of (e.g., longer, shorter, same as) the sampling duration of the other ADC module 122 or 124. This allows the ADC modules 122 and 124 to operate simultaneously and in parallel with one another with little risk of mutual interference or resource sharing conflicts. Consequently, the microcontroller 120 may access and control each ADC module 122 or 124 independently of (e.g., before, after, same time as) the other ADC module 122 or 124 with little risk of mutual interference or resource sharing conflicts. For example, the microcontroller 120 may reconfigure various parameters of each ADC module independently of the other ADC module, including sampling frequency, data resolution, data format, voltage reference, channel configuration, DMA configuration, and the like. Similarly, the microcontroller 120 may obtain data from each ADC module (i.e., read one or more of the data registers therein) independently of the other ADC module. Likewise, the microcontroller 120 may start and stop each ADC module and/or service any interrupts from each ADC module independently of the other ADC module.

Figure 3:
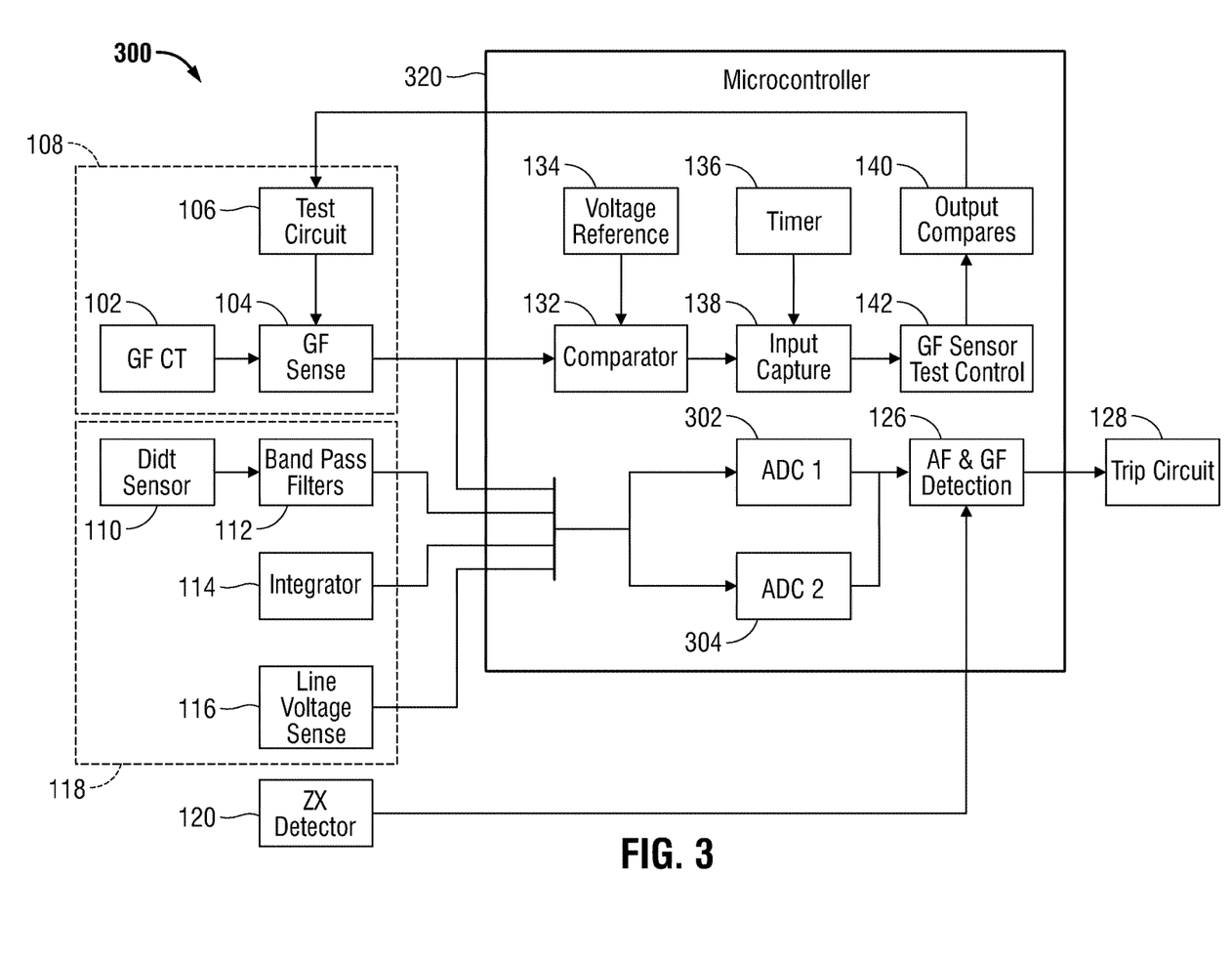
FIG. 3 is an exemplary block diagram for an alternative dual function circuit breaker in accordance with the embodiments disclosed herein.

In the above embodiments, one ADC module 122 is embedded within the microcontroller 120 while the other ADC module 124 is external to the microcontroller 120. FIG. 3 depicts an alternative circuit breaker 300 in which both ADC modules may be embedded within the microcontroller 320. As can be seen, the circuit breaker 300 is otherwise the same as the circuit breaker 100 of FIG. 1, except there are two ADC modules 302 and 304 embedded in the microcontroller 320. Having both ADC modules 302 and 304 embedded in the microcontroller 320 is advantageous in that the ADC modules 302 and 304 do not take up space on the printed circuit board.

Figure 4:
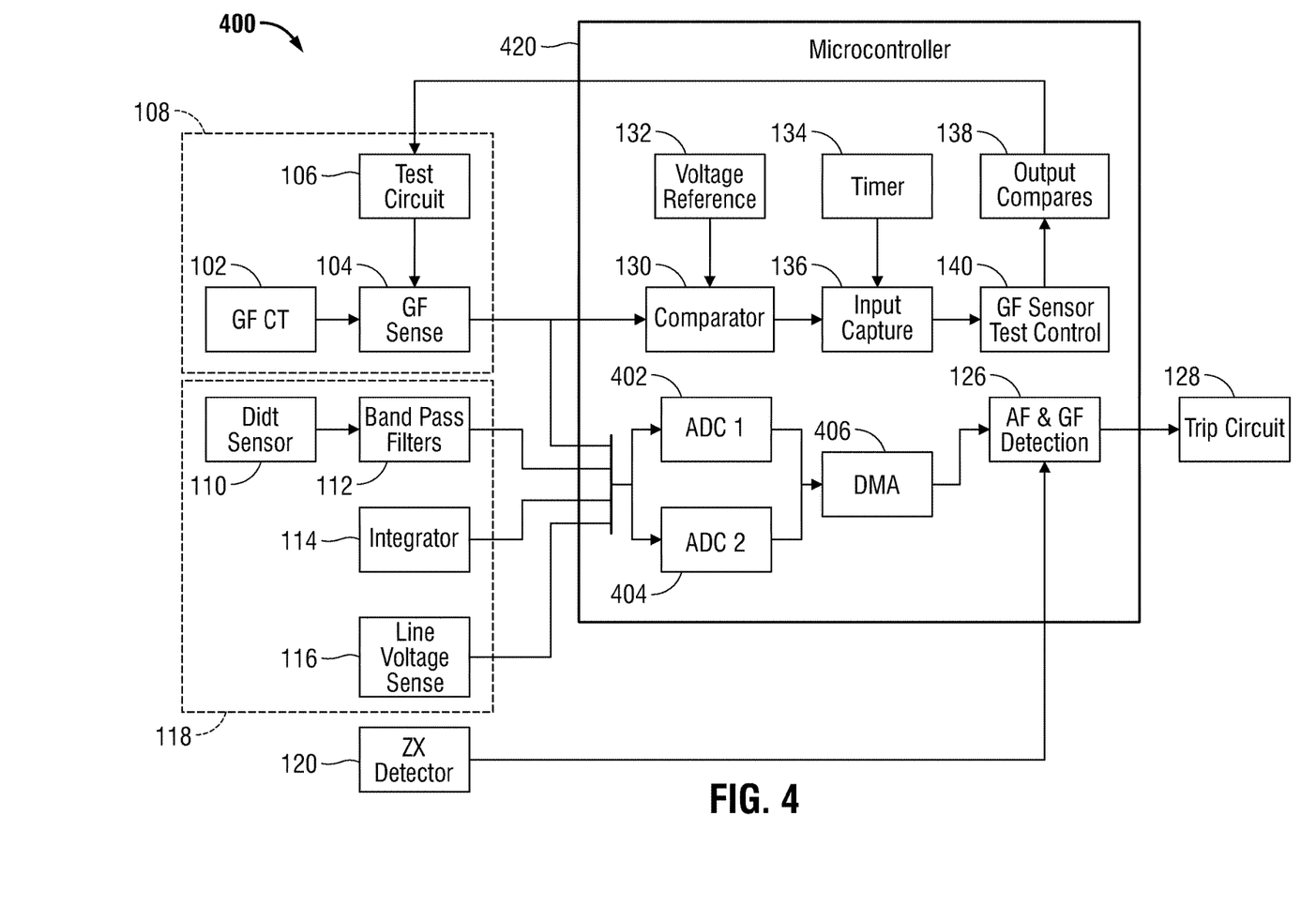
FIG. 4 is an exemplary block diagram for another alternative dual function circuit breaker in accordance with the embodiments disclosed herein.

FIG. 4 illustrates another alternative circuit breaker 400 in which a direct memory access (DMA) module may be used to access the ADC modules. As shown here, the circuit breaker 400 is otherwise the same as the circuit breaker 300 of FIG. 3 insofar as there are two ADC modules 402 and 404 embedded in the microcontroller 420. However, the microcontroller 420 here may include an embedded DMA module 406 that can directly access the ADC modules 402 and 404 and store the resulting data for subsequent use by the microcontroller 420. The presence of the DMA module 406 frees the microcontroller 420 to perform other tasks within the circuit breaker 400 instead of accessing the ADC modules 402 and 404.

Figure 5:
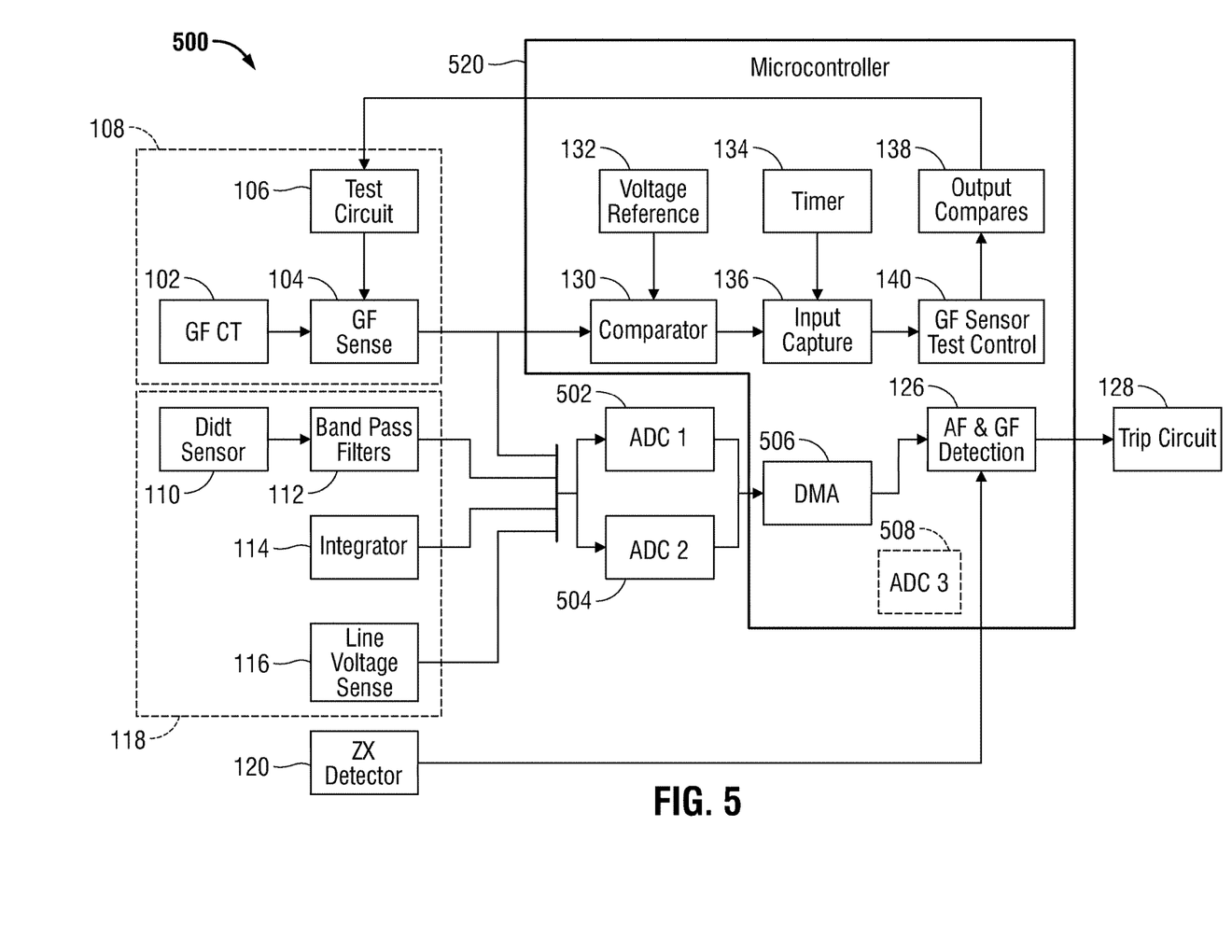
FIG. 5 is an exemplary block diagram for yet another alternative dual function circuit breaker in accordance with the embodiments disclosed herein.

FIG. 5 illustrates yet another alternative circuit breaker 500 in which a DMA module may be used to access the ADC modules. In this embodiment, however, there are two external ADC modules 502 and 504 instead of an embedded ADC module in the microcontroller 520. The DMA module 506 embedded in the microcontroller 520 may then be used to access these external ADC modules 502 and 504. It is also possible to have an optional third ADC module 508 (ADC 3) embedded in the microcontroller 520, for example, in order to divide up the ground fault sampling into separate ground-fault sampling and grounded-neutral fault sampling, or to perform some other operation in support of the single-pole or multi-pole circuit breaker.

In the foregoing embodiments, each of the two or more ADC modules is configured to sample a single ground fault or arc fault sensor such that each ADC module may have a single input and a single output, as may be the case with a single-pole circuit breaker. Examples of such single-input/single-output ADC modules may include the MCP3001 and MCP3201 stand-alone ADC from Microchip Technology, Inc. In some embodiments, however, each of the two or more ADC modules may be configured to sample multiple ground fault sensors or multiple arc fault sensors, as may be the case with a multi-pole circuit breaker. In these latter embodiments, each ADC module may have two or more inputs and two or more outputs that are used (or not used) as needed. Examples of such multi-input/multi-output ADC modules may include the MCP3X02/4/8 stand-alone ADC also from Microchip Technology, Inc. As well, the PIC16LF1554/9, PIC24FJ32GA002, and similar microcontrollers from the same manufacturer have one or more built-in ADC modules that may be selectively operated as either single-input/single-output or multi-input/multi-output.

Figure 6:
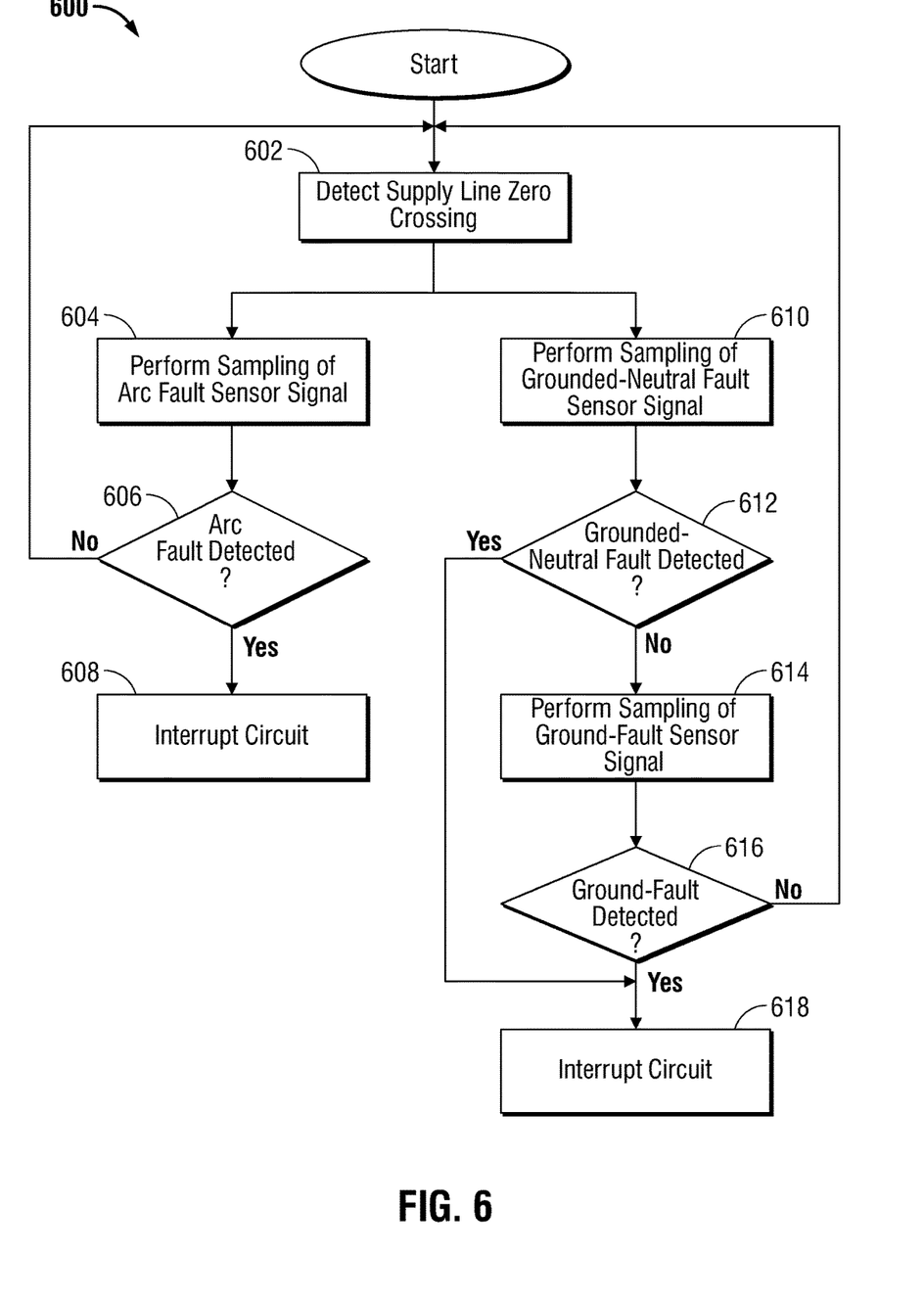
FIG. 6 is an exemplary flow diagram for performing arc fault detection, ground-fault detection and grounded-neutral fault detection in accordance with the embodiments disclosed herein.

Thus far, a number of specific implementations have been described for a dual function circuit breaker according to the embodiments disclosed herein. Following now in FIG. 6 are general guidelines in the form of a flow chart 600 that may be used to implement one or more of these embodiments. The flowchart 600 generally begins at block 602 where a supply line zero crossing is detected. This zero crossing initiates two parallel sampling processes, an arc fault sampling process and a ground fault sampling process. As discussed above, each sampling process may occur independently of the other sampling process because each sampling process uses a separate ADC module from the other sampling process.

Thus, in one process, sampling of an arc fault sensor signal is performed at block 604 using one of the ADC modules. A determination is made at block 606 whether an arc fault has occurred based on the sampling of the arc fault sensor signal. If the determination is yes, then the circuit is interrupted at block 608. If the determination is no, then the flowchart 600 returns to block 602 to await another supply line zero crossing.

In parallel with but independent of the above sampling process, samples of a grounded-neutral fault sensor signal is performed at block 610. A determination is made at block 612 whether a grounded-neutral fault has occurred based on the sampling of the grounded-neutral fault sensor signal. If the determination is yes, then the circuit is interrupted at block 618. If the determination is no, then sampling of a ground-fault sensor signal is performed at block 614. A determination is made at block 616 whether a ground-fault has occurred based on the sampling of the ground-fault sensor signal. If the determination is yes, then the circuit is again interrupted at block 618. If the determination is no, then the flowchart 600 returns to block 602 to await another supply line zero crossing.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the scope of the disclosed embodiments as defined in the appended claims.

What is claimed is:

1. A dual function circuit breaker, comprising:
a controller programmed to detect arc faults and ground faults;
a first ADC module accessible by the controller and configured to perform sampling of an arc fault signal;
a second ADC module accessible by the controller and configured to perform sampling of a ground fault signal;
an arc fault sensor configured to provide the arc fault signal to the first ADC module; and
a ground fault sensor configured to provide the ground fault signal to the second ADC module;
wherein the controller is programmed to access the first ADC module and the second ADC module independently of each other to obtain data for detecting the arc faults and ground faults, respectively.

2. The dual function circuit breaker according to claim 1, further comprising a direct memory access (DMA) module, wherein the controller is configured to obtain the data from the first ADC module and the second ADC module through the DMA module.

3. The dual function circuit breaker according to claim 1, wherein the first ADC module and the second ADC module are single-input and single-output ADC modules.

4. The dual function circuit breaker according to claim 1, wherein the first ADC module and the second ADC module are multi-input and multi-output ADC modules.

5. The dual function circuit breaker according to claim 1, wherein the circuit breaker is a dual function CAFI/GFCI circuit breaker.

6. The dual function circuit breaker according to claim 1, wherein the first ADC module performs sampling using a different sampling frequency from the second ADC module.

7. The dual function circuit breaker according to claim 1, wherein the first ADC module performs sampling using a different sampling duration from the second ADC module.

8. The dual function circuit breaker according to claim 1, wherein sampling of the ground fault signal comprise sampling of a ground-fault signal and sampling of a grounded-neutral fault signal.

9. The dual function circuit breaker according to claim 1, wherein the first ADC module and the second ADC module are each configured to be disabled or put into sleep mode independently of one another upon completion of sampling.

10. The dual function circuit breaker according to claim 9, wherein the first ADC module and the second ADC module may be disabled or sleeping at the same time.

11. The dual function circuit breaker according to claim 1, wherein the first ADC module is further configured to provide redundant sampling of the arc fault signal.

12. The dual function circuit breaker according to claim 1, wherein the second ADC module is further configured to provide redundant sampling of the ground fault signal.

13. The dual function circuit breaker according to claim 1, wherein both the first ADC module and the second ADC module are embedded in the controller.

14. The dual function circuit breaker according to claim 1, wherein one of the first ADC module and the second ADC module is embedded in the controller and the other one of the first ADC module and the second ADC module is external to the controller.

* * * * *